United States Patent
Lee et al.

(10) Patent No.: US 7,785,996 B2
(45) Date of Patent: Aug. 31, 2010

(54) NONVOLATILE MEMORY DEVICE AND METHOD OF MANUFACTURING THE SAME

(75) Inventors: Jung-hyun Lee, Yongin-si (KR); Kyu-sik Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 14 days.

(21) Appl. No.: 11/252,766

(22) Filed: Oct. 19, 2005

(65) Prior Publication Data

US 2006/0170033 A1 Aug. 3, 2006

(30) Foreign Application Priority Data

Feb. 3, 2005 (KR) .................. 10-2005-0010187

(51) Int. Cl.
*H01L 21/3205* (2006.01)
*H01L 21/4763* (2006.01)
(52) U.S. Cl. .............. 438/585; 257/315; 257/410; 257/E29.309; 257/E21.613; 438/247; 438/593; 438/686; 438/785; 365/185.11
(58) Field of Classification Search ............ 257/315, 257/410; 438/585
See application file for complete search history.

(56) References Cited

U.S. PATENT DOCUMENTS

| | | | | |
|---|---|---|---|---|
| 6,342,716 | B1 * | 1/2002 | Morita et al. ............. | 257/315 |
| 6,927,136 | B2 * | 8/2005 | Lung et al. ............... | 438/288 |
| 6,927,166 | B2 * | 8/2005 | Chung et al. ............. | 438/686 |
| 6,989,304 | B1 * | 1/2006 | Matsui et al. ............ | 438/240 |
| 7,005,697 | B2 * | 2/2006 | Batra et al. .............. | 257/315 |
| 2001/0016382 | A1 * | 8/2001 | Song et al. .............. | 438/240 |
| 2002/0013052 | A1 * | 1/2002 | Visokay .................. | 438/681 |
| 2003/0113588 | A1 * | 6/2003 | Uwazumi et al. ......... | 428/694 TS |
| 2003/0160277 | A1 * | 8/2003 | Bhattacharyya .......... | 257/310 |
| 2003/0235064 | A1 | 12/2003 | Batra et al. | |
| 2004/0264236 | A1 * | 12/2004 | Chae et al. .............. | 365/154 |
| 2005/0045943 | A1 * | 3/2005 | Lung et al. .............. | 257/325 |
| 2005/0122775 | A1 * | 6/2005 | Koyanagi et al. ........ | 365/185.11 |

(Continued)

FOREIGN PATENT DOCUMENTS

EP 1 536 483 6/2005

(Continued)

OTHER PUBLICATIONS

B. S. Lim, A. Rahtu, and R. G. Gordon, "Atomic layer deposition of transition metals," Nature Materials, vol. 2, Nov. 2003, pp. 749-754.*

(Continued)

*Primary Examiner*—Lynne A Gurley
*Assistant Examiner*—Meiya Li
(74) *Attorney, Agent, or Firm*—Harness, Dickey & Pierce, P.L.C.

(57) ABSTRACT

A nonvolatile memory device and a method of manufacturing the same are provided. The nonvolatile memory device includes a semiconductor substrate on which a source region, a drain region, and a channel region are formed, a silicon oxide layer formed on the channel region, a transition metal oxide layer having trap particles that trap electrons, formed on the silicon oxide layer, and a gate electrode formed on the transition metal oxide layer.

8 Claims, 6 Drawing Sheets

U.S. PATENT DOCUMENTS

| | | | |
|---|---|---|---|
| 2005/0199906 A1* | 9/2005 | Chan et al. .................. | 257/192 |
| 2005/0202615 A1* | 9/2005 | Duan et al. ................. | 438/197 |
| 2006/0022252 A1* | 2/2006 | Doh et al. .................... | 257/314 |
| 2006/0118853 A1* | 6/2006 | Takata et al. ................ | 257/314 |
| 2006/0211205 A1* | 9/2006 | Jeon et al. ................... | 438/264 |
| 2006/0244082 A1* | 11/2006 | Ahn et al. ................... | 257/410 |

FOREIGN PATENT DOCUMENTS

JP      2004-055969      2/2004

OTHER PUBLICATIONS

S. H. Oh et al., Thermal stability of RuO.sub.2/Ru bilayer thin film in oxygen atmosphere, Thin Solid Film 359 (2000) 118-123.*

\* cited by examiner

NONVOLATILE MEMORY DEVICE AND METHOD OF MANUFACTURING THE SAME

CROSS-REFERENCE TO RELATED PATENT APPLICATION

This application claims the benefit of Korean Patent Application No. 10-2005-0010187, filed on Feb. 3, 2005, in the Korean Intellectual Property Office, the disclosure of which is incorporated herein in its entirety by reference.

BACKGROUND OF THE DISCLOSURE

1. Field of the Invention

The disclosure relates to a nonvolatile memory device and a method of manufacturing the same, and more particularly, to a nonvolatile memory device having an increased trap site density and a method of manufacturing the same.

2. Description of the Related Art

In semiconductor memory devices, especially DRAMs (Dynamic Random Access Memory), a unit memory cell includes one transistor and one capacitor. Therefore, to increase the integration density of semiconductor memory devices, the volume of the transistor or the capacitor must be reduced.

In early semiconductor memory devices when the integration density was not a large concern, photography and etching processes could be performed with sufficient process margins. The integration density of semiconductor memory devices could be increased by reducing the volume of each element of the memory device.

However, as the demand for highly integrated semiconductor memory devices increases, a different method to reduce volume is needed.

The integration density of a semiconductor memory device is closely related to a design rule. Therefore, to increase the integration density, the design rule must be strict. In this case, the process margins of photography and etching processes can be significantly reduced, meaning that these processes must be performed more precisely.

When the process margins of the photography and etching processes are reduced, the yield can also be reduced. Therefore, a method to increase the integration density of semiconductor memory devices without reducing the yield is needed.

According to this requirement, many semiconductor memory devices having different structures than conventional semiconductor memory devices have been introduced by including a data storing medium that can store charge on the upper side of a transistor, with a different data storing function.

Figure 1:
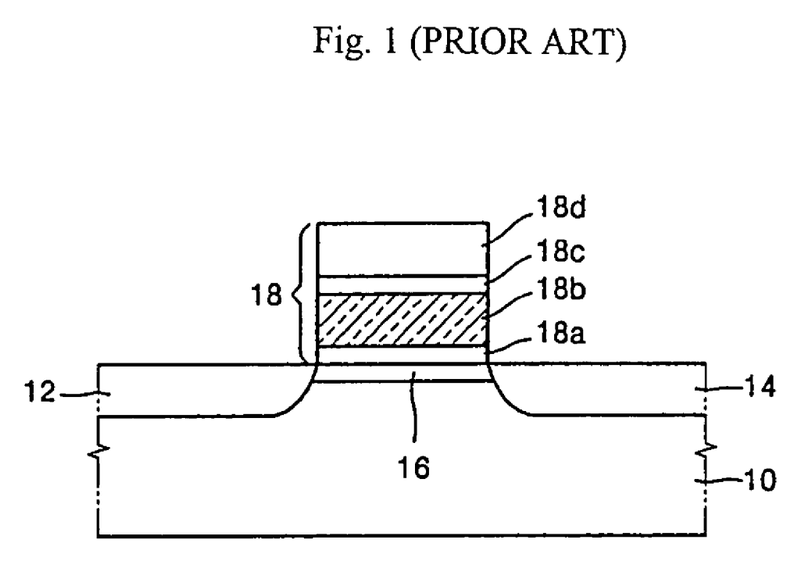
FIG. 1 is a cross-sectional view illustrating a conventional SONOS memory device.

The SONOS (Semiconductor-Oxide-Nitride-Oxide-Semiconductor) memory device is another newly introduced semiconductor memory device. FIG. 1 is a cross-sectional view illustrating a conventional memory device.

Referring to FIG. 1, a source region 12 and a drain region 14 to which an n type conductive dopant is implanted on a p type semiconductor substrate 10 (hereinafter, semiconductor substrate) are formed. A channel region 16 is formed between the source region 12 and the drain region 14. Also, a gate stack 18 is formed on the channel region 16 of the semiconductor substrate 10. The gate stack 18 is composed of a tunneling oxide film 18a, a nitride film $Si_3N_4$ 18b, a blocking oxide film 18c, and a gate electrode 18d. Here, the nitride film 18b has trap sites. Therefore, when a voltage is applied to the gate electrode 18d, electrons pass through the tunneling oxide film 18a and are trapped in the trap site of the nitride film 18b. The blocking oxide film 18c blocks the migration of electrons to the gate electrode 18d while the electrons are trapped.

In this conventional semiconductor memory device, binary scale information can be stored and read using the characteristic that the threshold voltage varies depending on whether electrons are trapped in the trap site of the nitride film 18b.

When the density of a trap site increases, more electrons can be trapped, and the variation of the threshold voltage can be increased. That is, the density of the trap site can significantly affect the characteristics of the memory device. Conventionally, to increase the density of a trap site, techniques of scattering or depositing nano-scale particles on the surface of a thin film have been developed. However, these methods can only provide limited increases in the density of the trap site per unit area. These methods have various technical problems, especially with respect to uniformity in the flash memory. Also, in the case of conventional memory devices, the only way to increase the integration density is to reduce the volume. However, since this makes the design rule more strict, there is a limit to increasing the integration density of memory devices by reducing their volume.

SUMMARY OF THE DISCLOSURE

The present invention may provide a nonvolatile memory device having increased density of trap sites and a method of manufacturing the nonvolatile memory device.

The present invention also provides a nonvolatile memory device comprising: a semiconductor substrate on which a source region, a drain region, and a channel region are formed; a silicon oxide layer formed on the channel region; a transition metal oxide layer having trap particles that trap electrons, formed on the silicon oxide layer; and a gate electrode formed on the transition metal oxide layer.

According to an aspect of the present invention, there may be provided a method of manufacturing a nonvolatile memory device, comprising: preparing a semiconductor substrate on which a source region, a drain region, and a channel region are formed; forming a silicon oxide layer on the channel region; forming a ruthenium layer on the silicon oxide layer; forming a transition metal oxide layer on the ruthenium layer; forming trap particles that trap electrons in the transition metal oxide layer, by diffusing ruthenium (Ru) into the transition metal oxide layer and annealing the resultant product; and forming a gate electrode on the transition metal oxide layer According to an aspect of the present invention, a nonvolatile memory device having increased trap site density can be obtained. Therefore, the signal processing speed of the memory device can be increased, and also, high capacity memory devices can be manufactured since multi-bit data can be stored in a unit cell.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EXEMPLARY EMBODIMENTS

The present invention will now be described more fully with reference to the accompanying drawings in which embodiments of the present invention are shown. In the drawings, the thicknesses of layers and regions are exaggerated for clarity.

Figure 2:
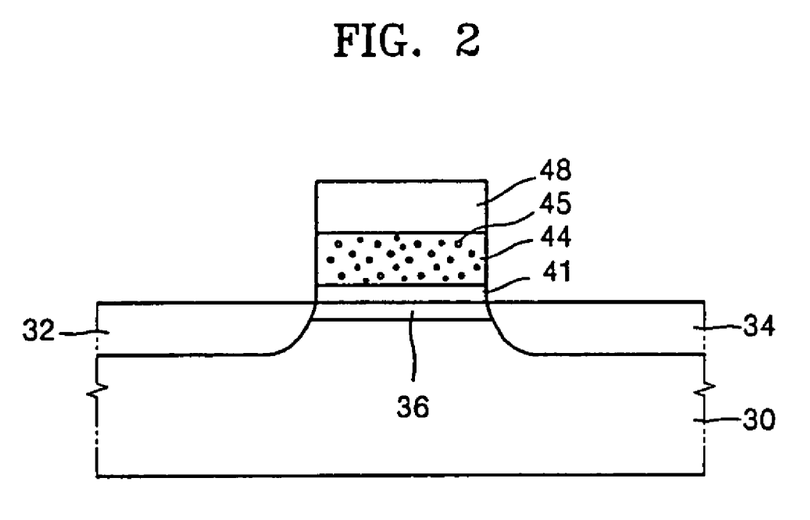
FIG. 2 is a cross-sectional view illustrating a nonvolatile memory device according to a first embodiment of the present invention.

FIG. 2 is a cross-sectional view illustrating a nonvolatile memory device according to a first embodiment of the present invention.

Referring to FIG. 2, a nonvolatile memory device according to the present invention comprises a substrate 30 on which a source 32, a drain 34, and a channel region 36 are formed. A silicon oxide layer 41, a transition metal oxide layer 44 that includes trap particles 45, and a gate electrode 48 are sequentially stacked on the channel region 36.

The source 32 and drain 34 regions are formed by implanting a conductive dopant into the substrate 30, and the channel region 36 is formed between the source and the drain regions 32 and 34.

Here, the transition metal oxide (TMO) is an oxide of a metal selected from the transition metals in the periodical table. Example of the transition metal oxides are nickel oxide (NiO), vanadium oxide ($V_2O_5$), zinc oxide (ZnO), niobium oxide ($Nb_2O_5$), titanium oxide ($TiO_2$), tungsten oxide $WO_3$, and cobalt oxide (CoO). The silicon oxide may possess the chemical formula $SiO_2$.

The trap particles 45 are compounds of transition metal oxides with ruthenium (Ru), and are distributed uniformly in the transition metal oxide layer 44. The trap particles 45 can be obtained by diffusing ruthenium (Ru) in the transition metal oxide layer 44. Ruthenium (Ru) forms trap sites by combining with the transition metal oxides due to lack of electrons in the d-orbital of ruthenium (Ru). Therefore, the trap particles 45, such as $RuTiO_2$, have trap sites.

In a nonvolatile memory device having the above structure, when a voltage is applied to the gate electrode 48, electrons enter the silicon oxide layer 41 and are trapped in the trap site of the trap particles 45 distributed in the transition metal oxide layer 44. The transition metal oxide layer 44 that surrounds the trap particles 45 blocks the migration of electrons to the gate electrode 48 while electrons are trapped in the trap site. Therefore, the nonvolatile memory device according to the present invention can store and read information using the characteristic that the threshold voltage varies depending on whether electrons are trapped in the trap site of the trap particles 45.

The conventional techniques of scattering or depositing nano-scale particles on the surface of a thin film to increase the density of the trap site can only provide limited improvements. However, the present invention can provide a higher trap site density than the conventional methods, since the trap particles 45 that trap the electrons are uniformly distributed in the transition metal oxide layer 44. Accordingly, a nonvolatile memory device having the above structure can operate at a higher speed and store multi-bit data in a unit cell, allowing the manufacture of high capacity memory devices. Also, a nonvolatile memory device according to the present invention does not require an additional blocking oxide layer for blocking the migration of electrons, since the trap particles that provide a trap site are formed in the transition metal oxide layer that blocks the migration of electrons. Therefore, the method of manufacturing a nonvolatile memory device according to the present invention is suitable for manufacturing high integration memory devices since the volume of the memory device and the number of manufacturing process steps can be reduced.

Figure 3:
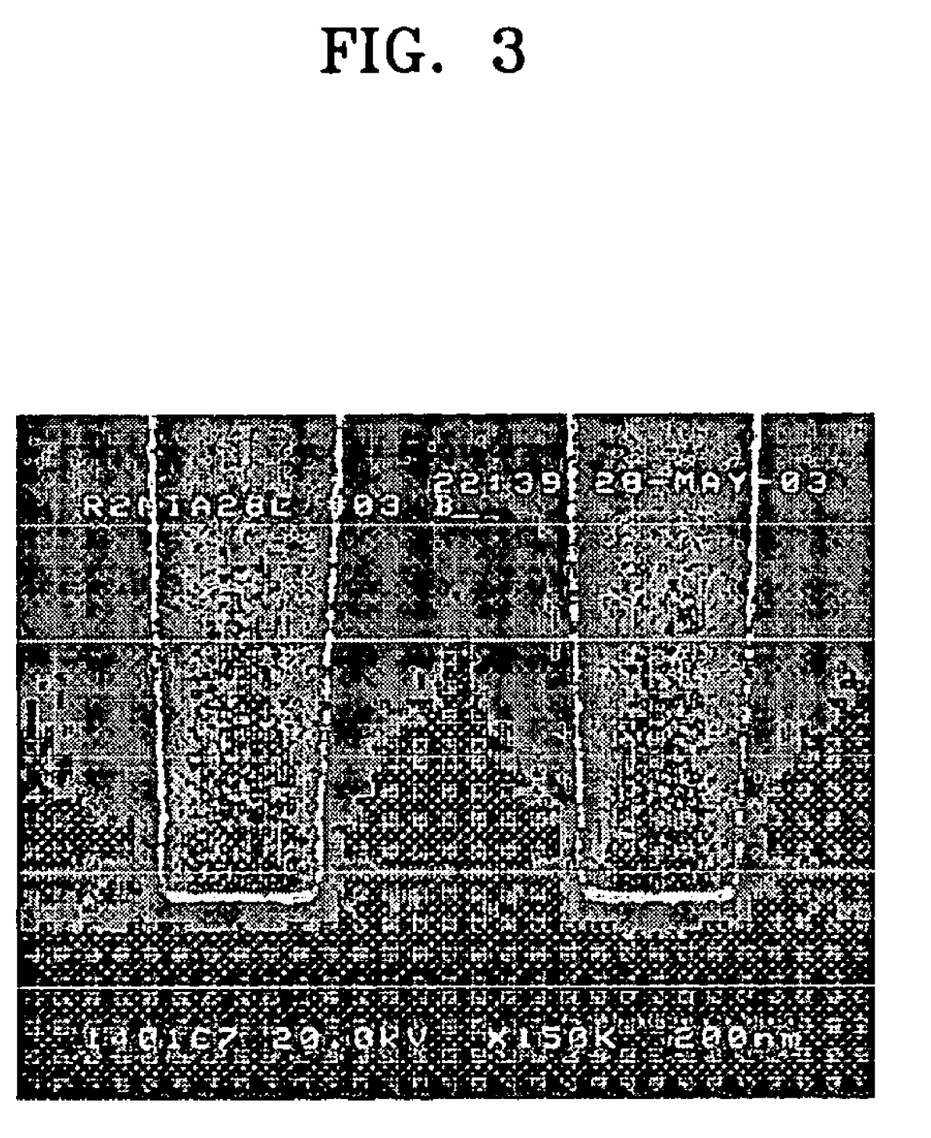
FIG. 3 is a SEM image of a cross-section of a transition metal oxide layer that includes the trapped particles of FIG. 2.

FIG. 3 is a SEM image of a cross-section of a transition metal oxide layer that includes the trapped particles of FIG. 2.

Figure 4:
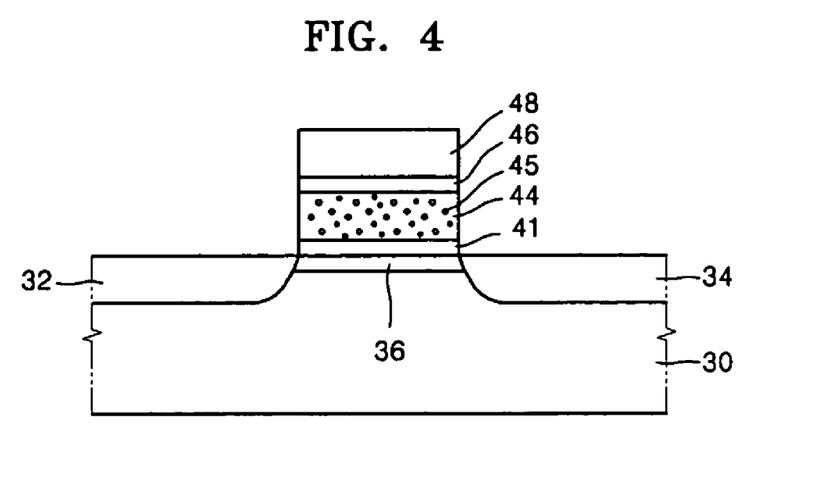
FIG. 4 is a cross-sectional view illustrating a nonvolatile memory device according to a second embodiment of the present invention.

FIG. 4 is a cross-sectional view illustrating a nonvolatile memory device according to a second embodiment of the present invention. Here, the descriptions of elements common to the first embodiment of FIG. 2 are omitted. Like reference numerals refer to like elements in the drawings.

The second embodiment differs from the first embodiment of FIG. 2 in that a blocking oxide layer 46 for blocking the migration of electrons is further included between the transition metal oxide layer 44 and the gate electrode 48. The blocking oxide layer 46 blocks the migration of electrons to the gate electrode 48 while trapping the electrons. The blocking oxide layer 46 is not essential, but performs an auxiliary or secondary blocking function for trapping the electrons since, as described above, the transition metal oxide layer 44 that surrounds the trap particles 45 can mostly block the migration of electrons to the gate electrode 48 while the electrons are trapped in the trap site. The blocking oxide layer 46 can be formed of silicon oxide or a transition metal oxide.

FIG. 5A through FIG. 5G are cross-sectional views illustrating a method of manufacturing a nonvolatile memory device according to an embodiment of the present invention.

Figure 5A:
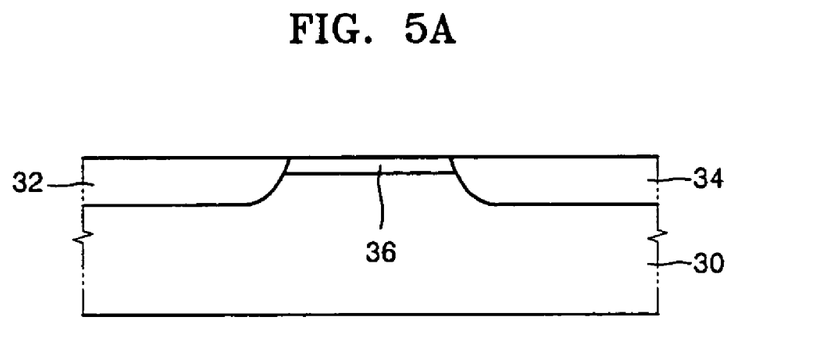
FIG. 5A through FIG. 5G are cross-sectional views illustrating a method of manufacturing a nonvolatile memory device according to an embodiment of the present invention.
Figure 5B:
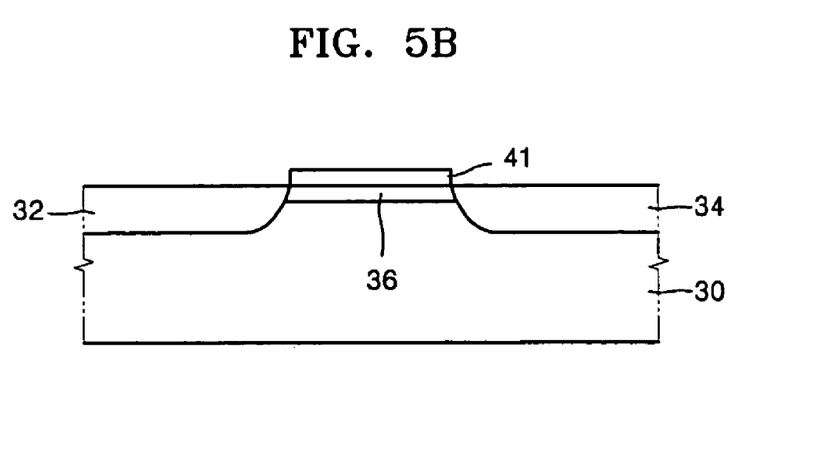

Referring to FIGS. 5A and 5B, a semiconductor substrate 30 is prepared, on which a source 32, a drain 34, and a channel region 36 are formed. The source and the drain regions 32 and 34 can be formed by implanting a conductive dopant in the substrate 30, and the channel region 36 is formed between the source and the drain regions 32 and 34. Next, a silicon oxide layer 41 is formed on the channel region 36. The silicon oxide layer 41 can be formed of $SiO_2$.

Figure 5C:
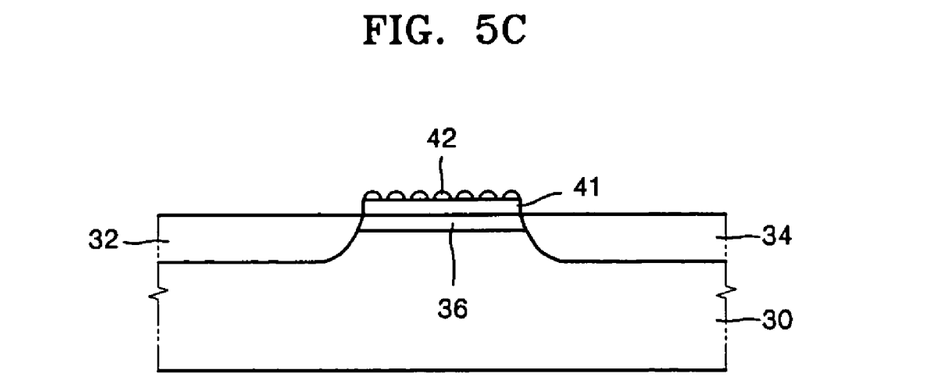
Figure 5D:
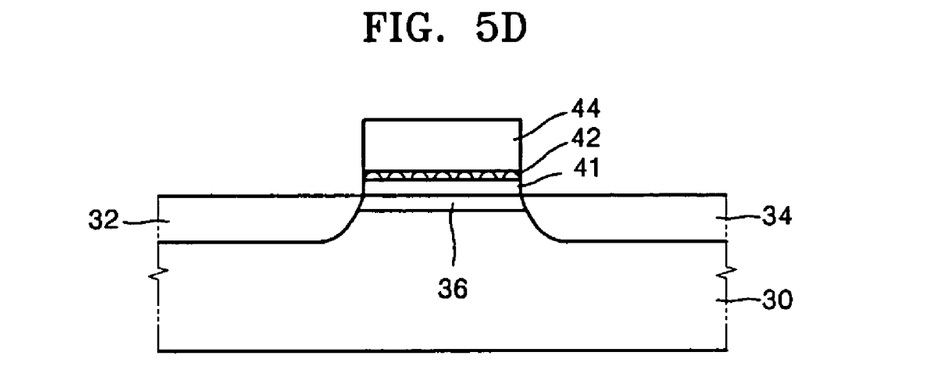

Referring to FIGS. 5C and 5D, a ruthenium layer 42 is formed on the silicon oxide layer 41 by depositing ruthenium (Ru). Next, a transition metal oxide layer 44 is formed on the ruthenium layer 42. Here, the TMO is an oxide of a metal selected from the transition metals in the periodical table. Examples of the transition metal oxides are nickel oxide (NiO), vanadium oxide ($V_2O_5$), zinc oxide (ZnO), niobium oxide ($Nb_2O_5$), titanium oxide ($TiO_2$), tungsten oxide ($WO_3$), and cobalt oxide (CoO). The silicon oxide may possess the chemical formula $SiO_2$.

Figure 5E:
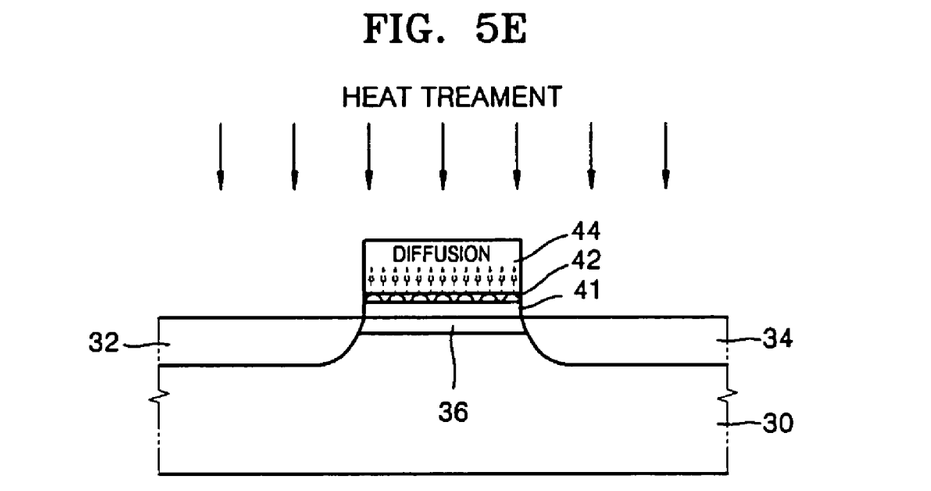
Figure 5F:
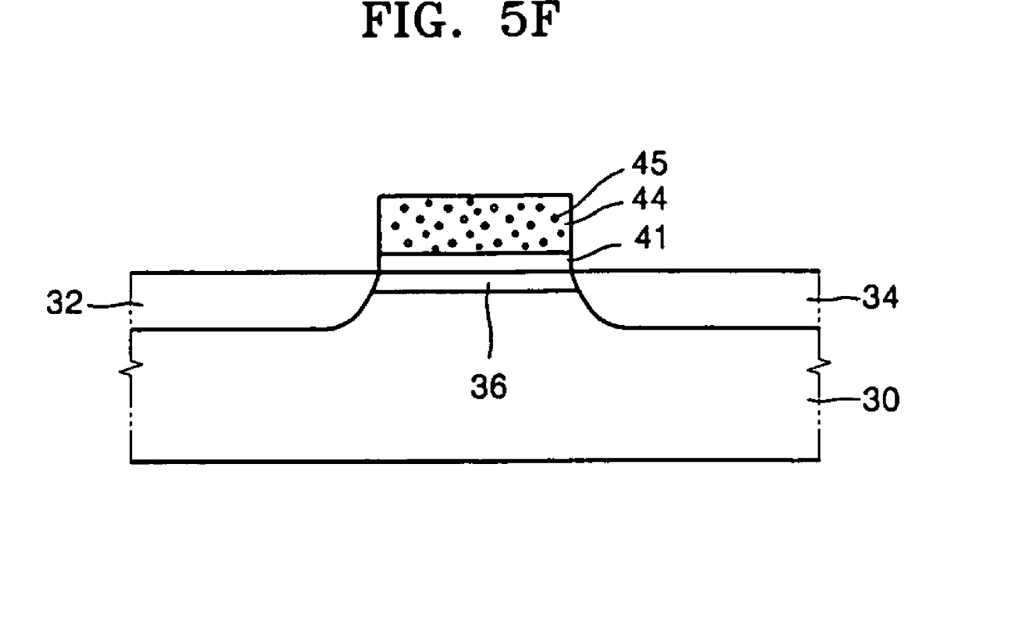

Referring to FIGS. 5E and 5F, the resultant product is annealed at a temperature range of approximately 400-700° C. for approximately 0.01-20 minutes under an inert gas atmosphere.

At this time, the solubility of ruthenium (Ru) is very low in the silicon oxide layer 41 but very high in the transition metal oxide layer 44. Therefore, ruthenium (Ru) atoms from the ruthenium layer 42 diffuse into the transition metal oxide layer 44 during the annealing process, and form trap particles 45 in the transition metal oxide layer 44. The trap particles 45 are compounds of ruthenium (Ru) and transition metal oxides. Ruthenium (Ru) forms trap sites by combining with the transition metal oxides due to a lack of electrons in the d-orbital of ruthenium (Ru). Therefore, the trap particles 45, such as $RuTiO_2$, have trap sites.

Ruthenium (Ru) can be distributed uniformly in the transition metal oxide layer 44 by controlling process variables of the annealing. Accordingly, the trap particles 45 can be formed uniformly in the transition metal oxide layer 44.

Figure 5G:
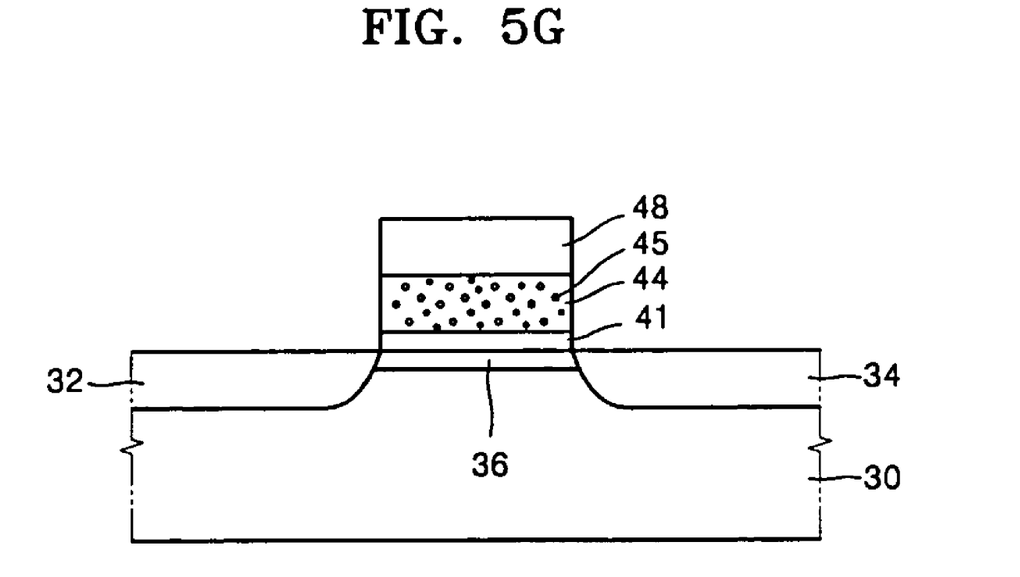

Referring to FIG. 5G, a gate electrode 48 is formed on the transition metal oxide layer 44. Accordingly, a nonvolatile memory device having increased trap site density can be obtained through the above processes.

According to another embodiment of the present invention, a blocking oxide layer that blocks the migration of electrons can further be formed on the transition metal oxide layer 44, and the gate electrode 48 is formed on the blocking oxide layer 46.

Figure 6A:
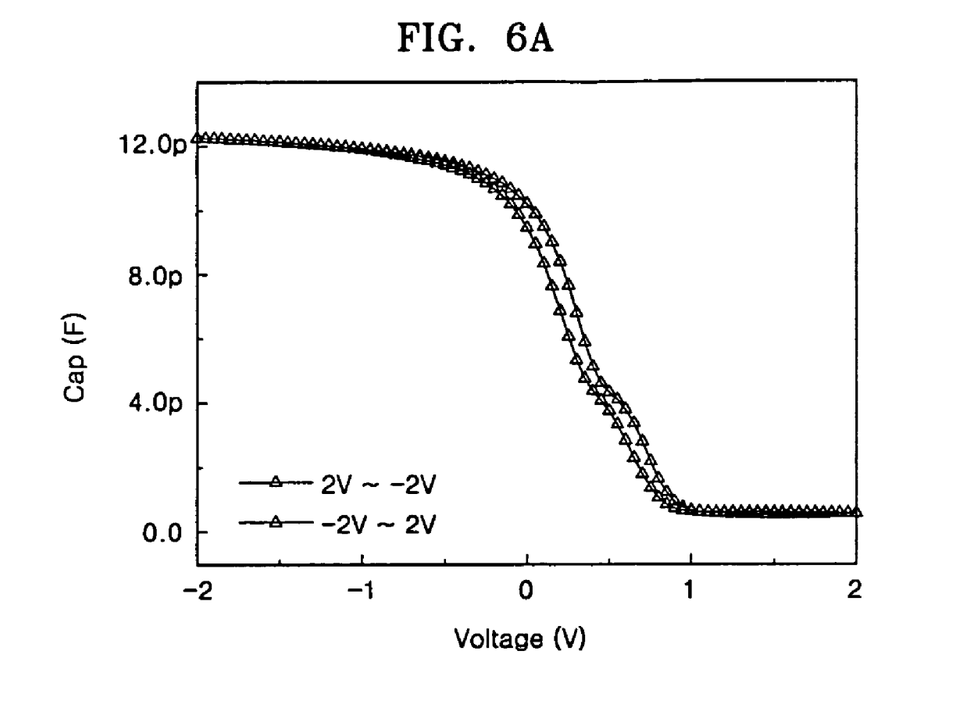
FIGS. 6A and 6B are graphs showing capacitance-voltage (C-V) characteristics of a transition metal oxide layer respectively before and after annealing (that is, before and after forming trap particles).
Figure 6B:
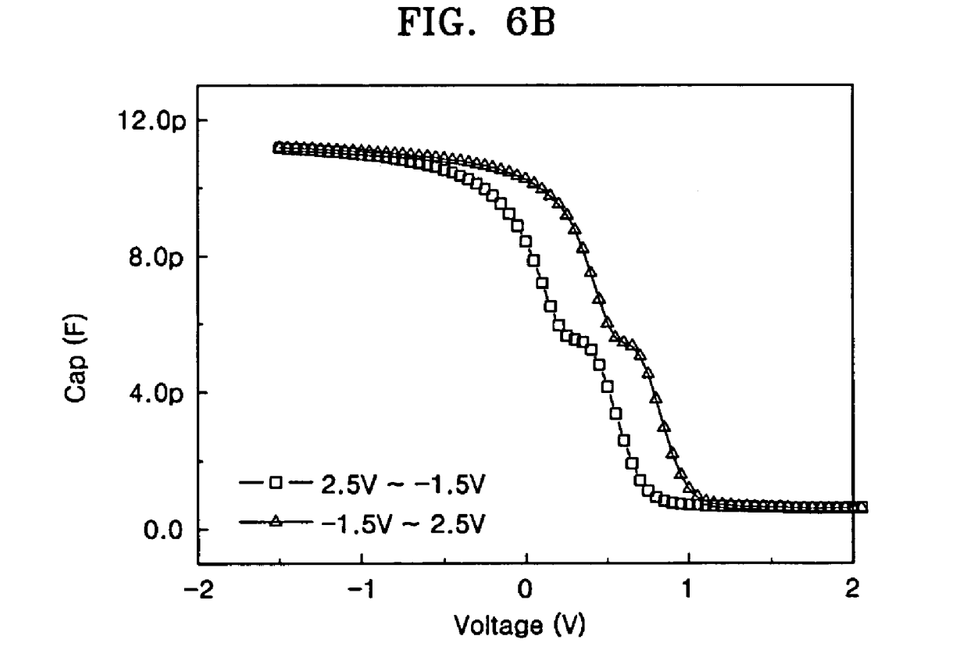

FIGS. 6A and 6B are graphs showing the capacitance-voltage (C-V) characteristics of a transition metal oxide layer before and after annealing (that is, before and after forming trap particles) respectively. After annealing, the variation of the threshold voltage is increased, indicating that the density of the trap site is increased.

According to the present invention, a nonvolatile memory device having increased trap site density can be obtained. This nonvolatile memory device has a large threshold voltage variation when electrons are trapped in the trap site. Therefore, the signal processing speed of the memory device can be increased, and also, high capacity memory devices can be manufactured since multi-bit data can be stored in a unit cell.

In particular, a nonvolatile memory device according to the present invention does not require an additional blocking oxide layer for blocking the migration of electrons, since the trap particles that provide a trap site are formed in the transition metal oxide layer that blocks the migration of electrons. Therefore, the method of manufacturing a nonvolatile memory device according to the present invention is suitable for manufacturing highly integrated memory devices since the volume of the memory device and the number of manufacturing process steps can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a nonvolatile memory device, comprising:
   preparing a semiconductor substrate on which a source region, a drain region, and a channel region are formed;
   forming a silicon oxide layer on the channel region;
   forming a ruthenium layer having ruthenium atoms on the silicon oxide layer;
   forming a transition metal oxide layer on the ruthenium layer to form a resultant product comprising the substrate, the source region, the drain region, the channel region, the silicon oxide layer, the ruthenium layer, and the transition metal oxide layer;
   forming ruthenium trap particles that trap electrons in the transition metal oxide layer by annealing the resultant product, wherein the ruthenium atoms diffuse into the transition metal oxide layer to form the ruthenium trap particles in the transition metal oxide layer; and
   forming a gate electrode on the transition metal oxide layer.

2. The method of claim 1, wherein the trap particles are compounds of ruthenium (Ru) and transition metal oxides (TMOs).

3. The method of claim 1, wherein the trap particles include trap sites that trap electrons.

4. The method of claim 1, wherein the trap particles are uniformly distributed in the transition metal oxide layer.

5. The method of claim 1, wherein ruthenium (Ru) is uniformly distributed in the transition metal oxide layer.

6. The method of claim 1, wherein the annealing is performed at a temperature range of approximately 400-700° C. for approximately 0.01-20 minutes under an inert gas atmosphere.

7. The method of claim 1 further comprising forming a blocking oxide layer that blocks the migration of electrons, between forming the trap particles in the transition metal oxide layer and forming the gate electrode on the transition metal oxide layer.

8. The method of claim 7, wherein the blocking oxide layer is formed of silicon oxide or a transition metal oxide.

* * * * *